(12) United States Patent
Müller et al.

(10) Patent No.: US 10,015,875 B2
(45) Date of Patent: Jul. 3, 2018

(54) DEVICE FOR DISSIPATING HEAT FROM AT LEAST ONE ELECTRONIC COMPONENT

(71) Applicant: ZF Friedrichshafen AG, Friedrichshafen (DE)

(72) Inventors: Karl-Heinz Müller, Auerbach (DE); Matthias Heid, Schnabelwaid (DE); Horst Hübner, Bayreuth (DE)

(73) Assignee: ZF Friedrichshafen AG, Friedrichshafen (DE)

(*) Notice: Subject to any disclaimer, the term of this patent is extended or adjusted under 35 U.S.C. 154(b) by 0 days.

(21) Appl. No.: 14/997,177

(22) Filed: Jan. 15, 2016

(65) Prior Publication Data
US 2016/0212835 A1    Jul. 21, 2016

(30) Foreign Application Priority Data
Jan. 15, 2015   (DE) .................. 10 2015 200 548

(51) Int. Cl.
*H05K 1/02* (2006.01)
*H05K 3/00* (2006.01)
*H05K 7/20* (2006.01)

(52) U.S. Cl.
CPC ......... *H05K 1/0203* (2013.01); *H05K 3/0061* (2013.01); *H05K 7/20472* (2013.01); *H05K 7/20854* (2013.01)

(58) Field of Classification Search
CPC ........... H05K 7/20436; H05K 7/20445; H05K 7/20454; H05K 7/2049; H05K 1/0203; H05K 3/0061; H05K 7/20472; H05K 7/20854
See application file for complete search history.

(56) References Cited

U.S. PATENT DOCUMENTS

| | | | | |
|---|---|---|---|---|
| 4,233,645 A | * | 11/1980 | Balderes | H01L 23/3733 174/16.3 |
| 5,459,352 A | * | 10/1995 | Layton | H01L 23/3733 257/713 |
| 5,623,394 A | * | 4/1997 | Sherif | H01L 23/3737 165/185 |
| 5,812,375 A | * | 9/1998 | Casperson | H05K 1/0204 165/80.3 |
| 6,365,964 B1 | * | 4/2002 | Koors | H01L 23/3675 257/707 |

(Continued)

FOREIGN PATENT DOCUMENTS

DE    10 2013 204 029 A1    9/2014

*Primary Examiner* — Adrian S Wilson
(74) *Attorney, Agent, or Firm* — Brinks Gilson & Lione

(57) ABSTRACT

The current embodiments provide an assembly for cooling a printed circuit board with at least one electronic component disposed on a first surface of the printed circuit board. The assembly may have a housing with first and second elastic elements and a cooling element configured to cool the at least one electronic component. The printed circuit board may be held between the first and second elastic elements in the housing. The assembly may further have at least one cooling surface region protruding from the cooling element and facing toward a second surface facing opposite the first surface of the printed circuit board in a region opposite of the electronic component.

18 Claims, 1 Drawing Sheet

(56) References Cited

U.S. PATENT DOCUMENTS

| | | | | |
|---|---|---|---|---|
| 7,023,699 B2* | 4/2006 | Glovatsky | H05K 7/2049 | 165/185 |
| 7,221,570 B2* | 5/2007 | Depew | H01L 23/433 | 165/80.3 |
| 7,780,469 B2* | 8/2010 | Zschieschang | H01L 23/367 | 361/704 |
| 7,782,621 B2* | 8/2010 | Matsushiba | H01L 23/13 | 165/185 |
| 8,040,677 B2* | 10/2011 | Lee | H05K 7/20963 | 361/704 |
| 2002/0092163 A1* | 7/2002 | Fraivillig | H05K 3/0061 | 29/847 |
| 2002/0179289 A1* | 12/2002 | Yamashita | H01L 23/3737 | 165/104.33 |
| 2003/0184969 A1* | 10/2003 | Itabashi | H05K 1/0206 | 361/688 |
| 2008/0310131 A1* | 12/2008 | Fino | H05K 7/20454 | 361/758 |
| 2010/0208422 A1* | 8/2010 | Tai | G06F 1/20 | 361/679.31 |
| 2012/0106070 A1* | 5/2012 | Landon | G06F 1/183 | 361/679.47 |
| 2013/0120932 A1* | 5/2013 | Tan | G06F 1/20 | 361/679.54 |
| 2013/0294040 A1* | 11/2013 | Fukumasu | H02M 1/44 | 361/752 |

\* cited by examiner

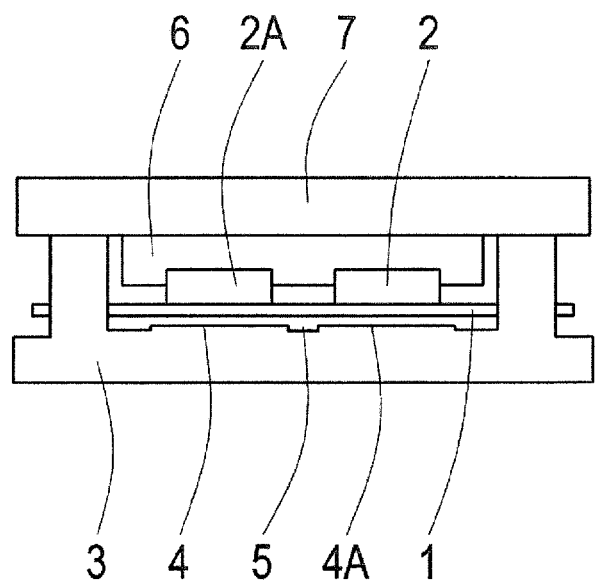

DEVICE FOR DISSIPATING HEAT FROM AT LEAST ONE ELECTRONIC COMPONENT

CROSS-REFERENCE TO RELATED APPLICATIONS

This current application claims the priority of German Patent Application DE 10 2015 200 548.8, filed on Jan. 15, 2015, which is incorporated by reference herein in its entirety.

BACKGROUND

The present invention relates to an assembly for cooling at least one electronic component disposed on a printed circuit board in accordance with the type defined in greater detail in the preamble of claim 1.

By way of example, a device for cooling an electronic device and an associated production method are known from DE 10 2013 204 029 A1. The cooling device is intended for a control device, which is disposed in a housing and comprises an electronic circuit disposed on a printed circuit board, having an element that produces a lossy line, wherein a contact pressure for establishing mechanical and thermal contact with the printed circuit board is provided on the housing. The contact pressure is disposed adjacent to the element producing a lossy line.

Tensions arise due to the different heights and tolerances of the electrical components in the circuitry, and because of bends in the printed circuit board, or carrier plate, respectively, which lead to the cooling surfaces of the components or printed circuit board not lying, or lying with different pressures, against the cooling device. As a result of the high working temperatures, the poorly cooled elements reduce the lifetime of the electronic components.

BRIEF DESCRIPTION OF THE DRAWINGS

The FIGURE shows a schematic view of a possible embodiment variation of an assembly for cooling at least one electronic component 2, 2A disposed on a printed circuit board 1 via a cooling element 3.

DETAILED DESCRIPTION

The present embodiments addresses the object of proposing an assembly of the type described above, with which a sufficient cooling, or heat discharge, of the electronic components is enabled and furthermore, a tension-free mounting of the printed circuit board is implemented.

This object is achieved in accordance with the present embodiments by the features of claim 1, wherein in advantageous designs can be derived from the dependent Claims, the description and the drawings.

Thus, an assembly for heat discharge, or cooling, of at least one of the electronic components disposed on a printed circuit board or suchlike via at least one cooling element is proposed, wherein the printed circuit board is held between elastic elements to compensate for tolerances in a housing or suchlike, wherein at least one cooling surface region protruding from the cooling element faces the undersurface of the printed circuit board that is to be cooled in the region of the component disposed on the upper surface.

In this manner, the printed circuit board having the electric components is preferably clamped between two elastic elements, specifically on the upper surface and the lower surface. There are raised regions on the cooling element, in the form of cooling surfaces, which are disposed directly beneath the surfaces of the printed circuit board that are to be cooled. Preferably, an elastic thermally conductive film, or thermally conductive pad, or suchlike, is provided as an elastic component between the protruding cooling surface region and the undersurface of the printed circuit board. The rises, or raised cooling regions are designed such that the thermally conductive film is not damaged by pressure.

On the opposite side, or in the region of the upper surface, of the printed circuit board, a rubber element, as an additional elastic element, or an element with similar properties, is pressed directly onto the electronic components using a stable housing frame element. Alternatively, the elastic element can also be pressed onto the printed circuit board directly adjacent to the electronic component. It is also conceivable that the elastic element is pressed onto both the components as well as the upper surface of the printed circuit board.

With the proposed assembly, a secure, uniform pressure can be achieved in the region of the surfaces on the thermally conductive film, or on the cooling element, respectively, that are to be cooled, despite different structural heights or tolerances with electronic components that lie closely packed together. As a result, there is no tension to the printed circuit board as a result of tolerances at the screw connections or the rigid elements.

The assembly according to the present embodiments can be used, for example, in the power electronics of a vehicle transmission. By way of example, electronic components in a housing form the power electronics can be cooled there when the assembly is provided.

The present embodiments shall be explained in greater detail below based on the single FIGURE.

The FIGURE shows a schematic view of a possible embodiment variation of an assembly for cooling at least one electronic component 2, 2A disposed on a printed circuit board 1 via a cooling element 3.

In accordance with the present embodiments, it is provided that the printed circuit board 1 is held between two elastic elements in a housing, in order to compensate for tolerances, wherein at least one cooling surface region 4, 4A protruding from the cooling element 3 faces the undersurface of the printed circuit board 1 that is to be cooled in the region of the component 2, 2A disposed on the upper surface.

To improve the heat transfer, an elastic element and an elastic thermally conductive film 5 are provided, in each case, between the protruding cooling surface regions 4, 4A and the undersurface of the printed circuit board 1. The elastic thermally conductive film 5 serves as a connection in the region of the undersurface of the printed circuit board between the surfaces that are specifically configured for cooling on the printed circuit board 1 and the rises 4, 4A formed on the cooling element 3, or the cooling plate, which serve to ensure the optimal connection between the printed circuit board 1 and the cooling element 3 directly on the surfaces that are to be cooled. Preferably, the elastic thermally conductive film 5 is made from an electrically insulating material. In this manner, the elastic thermally conductive film 5 also serves as an elastic element on the cooling side, as well as to establish an electric insulation between the printed circuit board 1 and the cooling element 3, or the housing, respectively. As a result, a significantly smaller structural shape can be obtained, and the configuration of the printed circuit board 1 is substantially more flexible.

As an elastic element, a rubber element 6, or suchlike having corresponding elastic properties, is provided on the upper surface of the printed circuit board 1, which is pressed against the upper surface of the printed circuit board 1 and/or against the components 3 disposed on the printed circuit board 1, via a housing frame element Because of the embedding on both sides with the assembly according to the present embodiments, there is absolutely no tension or torsion applied to the printed circuit board 1. Furthermore, a uniform pressure is applied to the surfaces that are to be cooled, and thus a uniform cooling of the components is likewise obtained.

As can be seen in the FIGURE, the protruding cooling surface regions 4, 4A on the at least one cooling element 3 forming the housing undersurface are formed as rises protruding into the interior opening. With the depicted design variation, two cooling surface regions 4, 4A are provided, by way of example, as rises. The cooling element 3 forms a housing element having a basically trough-shaped design, which is closed at the top by the stable housing frame element 7.

REFERENCE SYMBOLS 1 printed circuit board
2, 2A electronic component
3 cooling element
4, 4A cooling surface region
5 elastic thermally conductive film, or pad
6 rubber element
7 housing frame element

We claim:

1. An assembly for cooling a printed circuit board comprising at least one electronic component disposed on a first surface of the printed circuit board, the assembly comprising:
a housing having first and second elastic elements and a cooling element configured to cool the at least one electronic component, wherein the printed circuit board is held between the first and second elastic elements in the housing, and wherein the housing forms an interior opening beneath the circuit board; and
at least one cooling surface region protruding from the cooling element and into the interior opening positioned for cooling the at least one electric component, the at least one cooling surface region facing toward a second surface facing opposite the first surface of the printed circuit board in a region opposite of the electronic component,
wherein the second elastic element is substantially formed as an elastic thermally conductive film positioned between the at least one cooling surface region and the second surface of the printed circuit board.

2. The assembly according to claim 1, wherein the housing forms an interior opening beneath the circuit board, and wherein the second elastic element substantially fills the interior opening.

3. The assembly according to claim 1, wherein the elastic thermally conductive film is made from an electrically insulating material.

4. The assembly according to claim 1, wherein the first elastic element is coupled to a housing frame element, and wherein the first elastic element is configured to be pressed against the first surface of the printed circuit board.

5. The assembly according to claim 1, wherein the at least one cooling surface region protrudes into an interior opening of the housing, and wherein the cooling element forms at least a portion of an undersurface of the housing.

6. The assembly according to claim 1, wherein the electronic component is provided in a power electronics system of a vehicle transmission.

7. The assembly according to claim 1, comprising at least two cooling surface regions protruding from the cooling element and facing toward the second surface of the printed circuit board.

8. The assembly according to claim 1, wherein the at least one cooling surface region is formed as a portion of the cooling element.

9. The assembly according to claim 1, wherein the first elastic element and/or the second elastic element are configured to provide a uniform pressure on the printed circuit board.

10. An assembly for cooling a printed circuit board comprising an electronic component, the assembly comprising:
a housing having a frame element and a cooling element coupled to the frame element to define an interior opening configured to at least partially receive the printed circuit board; and
an elastic element coupled to the frame element and configured to press against a first outer surface of the printed circuit board,
wherein the cooling element includes a first cooling surface region protruding into the interior opening and toward the elastic element, the first cooling surface region configured to transfer heat from the printed circuit board, and the first cooling surface region being integral with the remainder of the cooling element,
the assembly further comprising an elastic thermally conductive film disposed on the first cooling surface region and configured to contact a second outer surface of the printed circuit board, the second outer surface facing opposite the first outer surface.

11. The assembly of claim 10, wherein the elastic thermally conductive film is made from an electrically insulative material.

12. The assembly of claim 10, wherein the cooling element at least partially forms an undersurface of the housing.

13. The assembly of claim 10, wherein the printed circuit board forms at least a portion of a power electronics system for a vehicle transmission.

14. The assembly of claim 10, wherein the first cooling surface region is configured to face a second outer surface of the printed circuit board, the second outer surface facing opposite the first outer surface.

15. The assembly of claim 10, the cooling element further comprising a second cooling surface region protruding into the interior opening, the second cooling surface region configured to transfer heat from the printed circuit board.

16. The assembly of claim 10, wherein the elastic element comprises an electrically insulative material.

17. The assembly of claim 10, wherein the elastic element substantially fills the interior opening such that the elastic element provides a uniform pressure on the printed circuit board.

18. A method for cooling a printed circuit board, the method comprising:
placing a printed circuit board within an interior opening of a cooling element, wherein at least one cooling surface region protrudes into the interior opening towards an undersurface of the printed circuit board; and closing the interior opening with a frame element such that an elastic element extending from the frame element contacts an upper surface of the circuit board and such that the elastic element substantially fills the interior opening, wherein an elastic thermally conductive film is disposed on the cooling surface region and contacts the undersurface of the printed circuit board at least when the interior space is closed.

\* \* \* \* \*

UNITED STATES PATENT AND TRADEMARK OFFICE
CERTIFICATE OF CORRECTION

PATENT NO.         : 10,015,875 B2
APPLICATION NO.    : 14/997177
DATED              : July 3, 2018
INVENTOR(S)        : Karl-Heinz Müller et al.

It is certified that error appears in the above-identified patent and that said Letters Patent is hereby corrected as shown below:

On the Title Page

Left Column, item (72), replace "Matthias Heid" with --Matthias Held--.

Signed and Sealed this
Eleventh Day of June, 2019

Andrei Iancu
*Director of the United States Patent and Trademark Office*